(12) United States Patent
Schiavoni et al.

(10) Patent No.: US 8,484,994 B2
(45) Date of Patent: Jul. 16, 2013

(54) METHOD OF OBTAINING A TEXTURED SUBSTRATE FOR A PHOTOVOLTAIC PANEL

(75) Inventors: Michele Schiavoni, Paris (FR); Didier Jousse, Taverny (FR); Frederic Utzmann, Paris (FR)

(73) Assignee: Saint-Gobain Glass France, Courbevoie (FR)

( * ) Notice: Subject to any disclaimer, the term of this patent is extended or adjusted under 35 U.S.C. 154(b) by 780 days.

(21) Appl. No.: 12/600,152

(22) PCT Filed: May 28, 2008

(86) PCT No.: PCT/FR2008/050927
§ 371 (c)(1),
(2), (4) Date: Nov. 13, 2009

(87) PCT Pub. No.: WO2008/152300
PCT Pub. Date: Dec. 18, 2008

(65) Prior Publication Data
US 2010/0154862 A1    Jun. 24, 2010

(30) Foreign Application Priority Data
May 31, 2007   (FR) ..................................... 07 55378

(51) Int. Cl.
*C03B 13/08*   (2006.01)
*C03B 13/16*   (2006.01)

(52) U.S. Cl.
USPC ....................... 65/93; 65/101; 65/245; 65/255

(58) Field of Classification Search
USPC ............. 65/64, 100, 101, 102, 106, 245, 253, 65/255, 256, 257, 258
See application file for complete search history.

(56) References Cited

U.S. PATENT DOCUMENTS

| 370,176 | A | * | 9/1887 | Brogan et al. | 65/93 |
| 370,178 | A | * | 9/1887 | Brogan et al. | 65/245 |
| 695,282 | A | * | 3/1902 | Cummings | 65/255 |
| 1,028,129 | A | * | 6/1912 | Neuhauser | 65/94 |
| 1,261,939 | A | * | 4/1918 | Johanson | 65/156 |
| 1,297,566 | A | * | 3/1919 | Johanson | 65/255 |
| 1,528,194 | A | * | 3/1925 | Burgess | 65/255 |

(Continued)

FOREIGN PATENT DOCUMENTS
WO   2005 111670   11/2005

OTHER PUBLICATIONS

U.S. Appl. No. 13/384,406, filed Jan. 17, 2012, Schiavoni, et al.
U.S. Appl. No. 12/598,042, filed Oct. 29, 2009, Counil, et al.

*Primary Examiner* — Jason L. Lazorcik
(74) *Attorney, Agent, or Firm* — Oblon, Spivak, McClelland, Maier & Neustadt, L.L.P.

(57) ABSTRACT

The invention relates to a method for obtaining an external covering of a photovoltaic device, said covering being constituted by a glass substrate having texturing in the form of at least one row of grooves that are mutually parallel and preferably spaced by a regular distance d, said method being characterized in that there is used, for the impression of said texturing, texturing means incorporating reliefs whose spacing is different from the distance d between two rows of grooves on the glass substrate.

The invention also relates to a substrate or to a photovoltaic module incorporating a substrate that can be obtained by application of the preceding method.

3 Claims, 12 Drawing Sheets

U.S. PATENT DOCUMENTS

| | | | |
|---|---|---|---|
| 1,718,824 A * | 6/1929 | Clement | 359/592 |
| 2,883,799 A * | 4/1959 | Wynne et al. | 65/93 |
| 3,238,031 A * | 3/1966 | Rupert | 65/94 |
| 3,847,582 A * | 11/1974 | Kozmin | 65/33.3 |
| 5,224,978 A * | 7/1993 | Hermant et al. | 65/94 |
| 6,030,829 A * | 2/2000 | Dannoux et al. | 435/288.3 |
| 6,586,077 B1 * | 7/2003 | Pettis | 428/192 |
| 6,679,085 B1 * | 1/2004 | Singer et al. | 65/162 |
| 7,114,353 B1 * | 10/2006 | Charlton et al. | 65/107 |
| 2004/0086716 A1 * | 5/2004 | Weikinger | 428/410 |
| 2007/0240754 A1 | 10/2007 | Gayout et al. | |
| 2009/0320899 A1 * | 12/2009 | Schiavoni et al. | 136/246 |
| 2010/0154862 A1 * | 6/2010 | Schiavoni et al. | 136/246 |

* cited by examiner

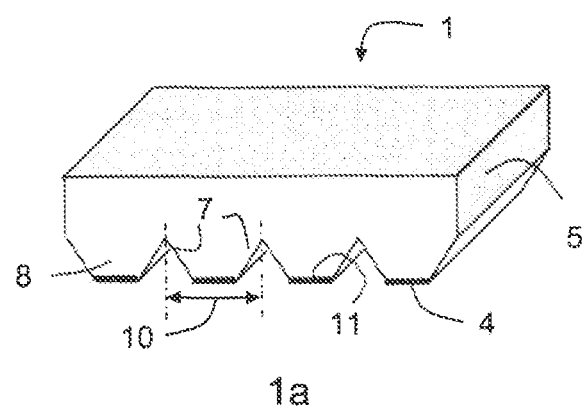
1a
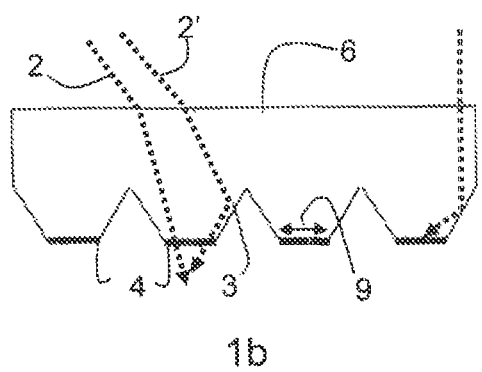
1b
FIG. 1

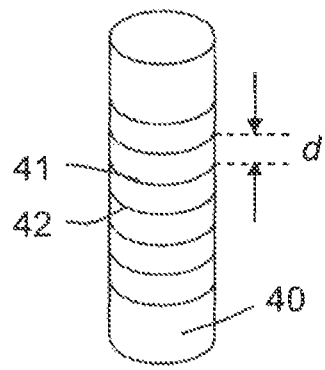
4a
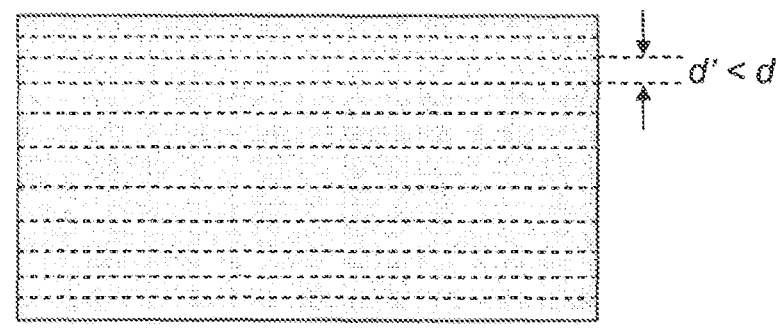
4b
FIG. 4

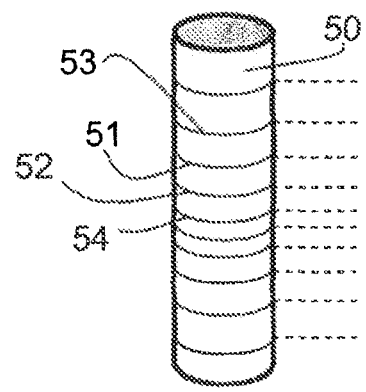
5a
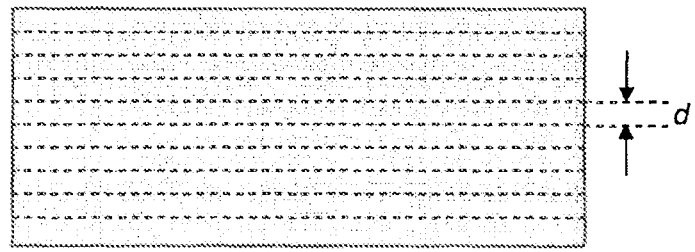
5b
FIG. 5

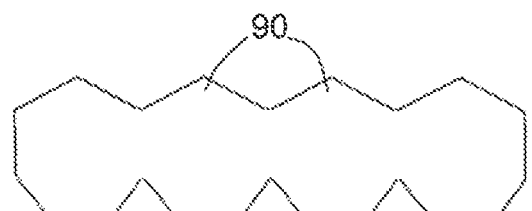
9a
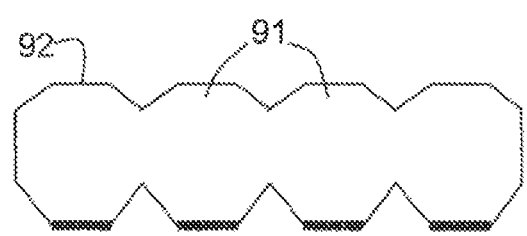
9b
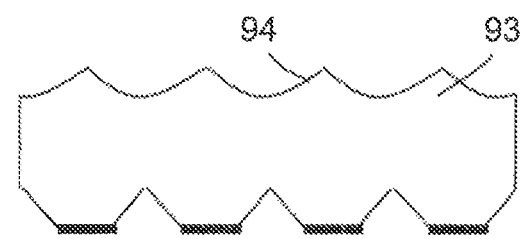
9c
FIG. 9

METHOD OF OBTAINING A TEXTURED SUBSTRATE FOR A PHOTOVOLTAIC PANEL

The present application is the U.S. counterpart of WO 2008/152300, the text of which is incorporated by reference, and claims the priority of French application No. 07 55378, filed May 31, 2007, the text of which is incorporated by reference.

The invention relates to the field of devices for converting solar energy into electrical energy for industrial or domestic application, comprising or constituted by photovoltaic modules. More particularly, the invention relates to the field of photovoltaic devices or modules integrating concentrators, being in the form of a textured substrate making it possible to concentrate and guide the incident light towards the photovoltaic cells allowing said conversion.

Solar energy is nowadays considered as a clean source of energy able in certain cases to be an alternative to fossil energies. The photovoltaic energy market in the industrial and domestic sectors have thus exhibited large growth rates for several years. In 2006, the global production of modules was about 2.1 GW (gigawatts), which is equivalent to about 15.5 million $m^2$ of modules (for a standard crystalline silicon module). The estimated growth rate for 2007 is 26%, after having been 23% in 2006 and 41% in 2005.

Among the various technologies of photovoltaic cells, that based on the silicon wafer (monocrystalline or polycrystalline) is greatly dominant, with about 95% of the market share. It is also noted that a certain number of thin layer technologies (amorphous Si, CIS, CdTe, etc) have appeared with more or less advantageous energy outputs and manufacturing costs. Such systems are obviously included in the context of the present invention.

It is known that the amount of energy generated by a photovoltaic device is influenced by various factors and more particularly by the amount of solar energy absorbed by a module, the conversion efficiency of the cells contained in said module, and the intensity of the light striking the module. Much research is currently aimed at improving the technology related to each of these aspects.

Moreover, the total amount of energy generated by the device is also obviously directly proportional to the area covered by the device, and more precisely by the cumulated area covered by the array of photovoltaic cells incorporated in the conversion system. Thus the amount of energy and also the cost of the investment are currently directly proportional to the size of the installation.

It is known that the initial cost of the installation at present constitutes the main brake on the development of the photovoltaic industry.

More particularly, the main element which currently limits an even stronger growth is the shortage of the Silicon used in the manufacture of the photovoltaic cells, for which the solar energy market is the greatest outlet. More particularly, this shortage explains to a large extent why the cost of a current installation grows not more essentially as a function of the global size of the installation, but mainly as a function of the part covered by the photovoltaic cells themselves.

In this context, an approach which has already been described consists in producing solar modules having a large area and integrating a textured substrate which allows the concentration of the light onto cells having a smaller area. In these modules, for substantially identical dimensions of the device and a substantially equivalent amount of collected energy, the introduction of light concentrators makes it possible to substantially reduce the area of the photovoltaic cells themselves, thereby reducing the overall cost of the installation.

The patent application WO2006/133126 or the application US2006/272698 describe possible ways of producing a textured substrate acting as a light concentrator.

The concentrator is shown diagrammatically in the appended FIG. 1, in perspective view (FIG. 1a) and in cross-section (FIG. 1b), in order to illustrate its functional principles. A photovoltaic module 1 is formed from a series of elementary photovoltaic cells 4 appearing in the form of strips stuck to a glass substrate 5. The substrate 5 has texturing 7 of the two-dimensional type, such as shown in FIG. 1a, configured to allow the trapping of light. More particularly, the texturing 7 can be described as constituted by a succession of triangular prisms 8, parallel to each other and whose ends are truncated, in such a way that the substrate exhibits, on its internal side, a flat strip 11 whose area corresponds to that of the photovoltaic strip 4 placed facing it.

The functional principle is easily understandable if the path of the rays 2 and 2', such as shown in FIG. 1b, is considered. The two rays are refracted at the air-glass interface 6. The ray 2 arrives directly onto the photovoltaic cell 4, whereas the ray 2' undergoes a total internal reflection, at point 3, before reaching the cell 4. Those skilled in the art will thus easily understand that the rays exhibiting even relatively high angles of incidence with respect to the normal to the surface of the substrate 5 will nevertheless be collected by the photovoltaic cells, which results in a concentration of the light, in the sense of the present invention. A concentration factor can also be calculated easily, corresponding to the ratio between the spacing 10 between two successive texturings and the width of the photovoltaic cells, that is to say the width 9 of the strip 11. The term "spacing" according to the present invention corresponds to the pitch of the texturing pattern, or to the distance between the median positions of two successive cells.

Moreover, the angle at which the light rays are received can be substantially increased by using a texturing in the form where the reliefs are comparable to those described with reference to FIG. 1 but whose sides 20 are rounded, as shown in FIG. 2. Parabolic sides have appeared to be very effective for trapping light.

Among the various materials that can be used for the substrate 5, a mineral glass has many advantages, in particular with regard to stability over time, its high resistance to temperature or to UV radiation for example. A glass with a low iron content is preferred in order to reduce absorption to the minimum. In particular, the Albarino® glass produced by the Saint-Gobain Glass company.

Even though they describe in a more or less complete way the structural details of the textured substrate, the prior publications do not give any indication with regard to the manufacturing method of such a textured substrate, particularly on an industrial scale.

However, the manufacturing method of the textured substrate, particularly when is it at least essentially of the glass type, in particular mineral, raises problems. In fact, it can be seen immediately, according to the illustration described in FIGS. 1 and 2, that during the manufacture of the photovoltaic module 1, the photovoltaic cells shown in these figures in the form of strips 4 must be placed with the greatest accuracy opposite the strips 11 over the whole surface of the module 1. Moreover, because of the production costs on the one hand and, on the other hand, because of the necessity of producing and checking, before assembly of the substrate 5, all of the electrical connections necessary for the correct functioning of the module, the manufacturing process imposes that the sticking of the set of photovoltaic strips 4 on the facing strips 11 of the textured substrate is carried out in a single and unique step.

In these conditions, it can therefore be seen that the substrate 11 must have a very accurately defined and regular texturing, not only with regard to the widths 9 of the strips 11, which must correspond exactly with those of the strips 4, but also with regard to the spacings 10 between two successive texturings.

The method most conventionally used for the manufacture of glass substrate of large size consists in a rolling method, the principle of which is illustrated by FIG. 3, in which the glass 30 in fusion, drawn over a refractory 33, is shaped by passing through metal rollers 32 and 34. The glass has a temperature of about 1200° C. before shaping and of about 850° C. at the output of the rolling machine. When it is desired to imprint a pattern or a texturing on the glass, a conventional technique consists in using rollers having the negative of the pattern or of the texturing that it is desired to obtain on the glass. These texturing techniques are notably known in the field of decorated glass or in the field of photovoltaic devices, for example in the publication EP 1774372. The rollers can indifferently have an impression on the upper face and/or on the lower face. In a well known way, the glass is then drawn and sent to a lehr.

In FIG. 4a, there has been shown a conventional model of a roller 40 having a constant spacing d between two texturing patterns 41 and 42. These texturing patterns are constituted, for example, by a set of reliefs or protrusions, for example of prismatic shape, present on the surface of the roller 40 and parallel to each other. The reliefs typically make it possible to obtain, on the inside face of the substrate 5, the texturing 7 previously described with reference to FIG. 1 or 2.

In FIG. 4b, there has been shown a photovoltaic substrate obtained using such a method. If the patterns are impressed during the rolling step by metal rollers having a relief characterized by a constant spacing d between the prismatic protrusions, the tests carried out by the applicant have shown that, most of the time, the spacing d' that is found on the final pane is not always rigorously constant, according to a distribution illustrated in FIG. 4 in a deliberately exaggerated way in order to give a better understanding. Without this being able to be considered as a definitive explanation or theory, it is possible that this phenomenon is related to the existence of a lateral contraction undergone by the glass substrate. This lateral contraction would not be constant over the whole width of the glass. Such phenomena can notably originate in the compacting of the substrate produced during its cooling and/or the stretching that it undergoes after the shaping.

Although this phenomenon does not present consequences in the majority of applications in which the glass is textured, in the particular case of a substrate for a photovoltaic application (concentrator) an inaccuracy in the positioning of the texturing on the glass, in the previously described sense, is incompatible with an industrial process because it does not allow a correct assembly of the module 1, for the previously explained reasons.

Because of these same imperatives with regard to the accuracy of the alignment between the texturing on the glass substrate and the photovoltaic cells, it is even more problematic to produce patterns in a direction perpendicular to the direction of drawing the glass, during its shaping.

The purpose of the present invention thus consists in a method making it possible to solve the previously described problems, and in particular consists in a method making it possible to obtain a glass substrate having a texturing whose accuracy is improved. Such an improvement has the effect of guaranteeing, during the manufacture of a photovoltaic module, notably on an industrial scale, a sufficiently accurate assembly of said substrate with the photovoltaic cells placed facing said texturing.

More precisely, the present invention relates to a method for obtaining an external covering of a photovoltaic device, said covering being constituted by a glass substrate having texturing in the form of at least one row of grooves that are mutually parallel and preferably spaced by a regular distance d, said method being characterized in that there is used, for the impression of said texturing, texturing means incorporating reliefs whose spacing is different from the distance d between two rows of grooves on the glass substrate.

For example, said impression means comprise at least one roller having reliefs whose spacing is different from the distance d between two rows of grooves on the glass substrate.

Typically, the spacing between two successive reliefs on the impression means is not constant.

According to a possible embodiment, the spacing between two successive reliefs on the impressing roller is minimal at the center of the roller and maximal at its ends.

For example, the increase in the spacing between two successive reliefs from the center of the roller towards its ends is progressive and linear.

According to another embodiment, the increase in the spacing between two successive reliefs from the center of the roller towards its ends is progressive and follows a parabolic law or a polynomial law of higher order.

The invention also relates to the glass substrate for photovoltaic application, having texturing whose accuracy is improved by the use of a manufacturing method such as previously described.

More particularly, the invention relates to a glass substrate for photovoltaic application able to be obtained by such a method and having on at least one of its main faces a texturing in the form of at least one row of mutually parallel grooves spaced by a regular mean distance d, said substrate being characterized in that, in the direction of the texturing, the maximal deviation between the position of a groove n and its theoretical position n×d is less than 10% of said mean distance d. Preferably, said maximal deviation is less than 5% or even 2% of said mean distance.

The glass substrate for photovoltaic application according to the invention has for example on at least one of its main faces a texturing in the form of at least one row of mutually parallel grooves spaced by a regular mean distance d and is characterized in that, in the direction of the texturing, the dispersion around the mean value is less than 2% of said distance d and preferably less than 1% of said distance d.

According to another aspect, the invention also relates to a substrate having such texturing on its two main faces. In this embodiment, as will be explained in the following embodiments, the performance of the module can be further improved.

More generally, it has been possible to obtain a photovoltaic module for the first time having sufficient accuracy according to the present invention, comprising a glass substrate having a texturing on its two main faces, the texturings of the inside face and of the outside face being configured and disposed with respect to each other in order to jointly procure an increase in the concentration factor of the incident solar radiation towards the zones of said inside face of said substrate in contact with which the photovoltaic cells are disposed in said module.

Up until the present time no method had been described making it possible to obtain such a substrate. By application of the previously described principles and method, it has been possible for the applicant to obtain such a substrate with a sufficient accuracy on the two opposite faces, in order to allow a substantial increase in the performance of the photovoltaic module.

According to certain embodiments of the invention, the texturings present on the internal and external faces of the glass substrate are disposed in parallel lines. The tests carried out by the applicant have shown that in this case said texturings on the inside face and on the outside face must preferably be configured and disposed accurately with respect to each other in order to jointly procure an additional increase in the light concentration factor.

According to other embodiments of the invention, the texturings present on the inside and outside faces of the glass substrate are disposed in orthogonal lines. In this case, the tests carried out by the applicant have shown that an accurate disposition of said texturings on the inside and outside faces with respect to each other was not essentially necessary in order to obtain the effect of an additional increase in the light concentration factor.

According to a first possible embodiment of the photovoltaic module, the texturing of the inside face of the glass substrate comprises at least one row of mutually parallel grooves, spaced by a distance d, and the texturing of the outside face consists of a row of mutually parallel grooves, disposed plumb over the grooves of the inside face and spaced by this same distance d.

According to another embodiment of the photovoltaic module, the texturing of the inside face of the glass substrate comprises at least one row of mutually parallel grooves, spaced by a distance d, and the texturing of the outside face consists of a row of mutually parallel cylindrical lenses spaced by this same distance d.

According to a third embodiment of the photovoltaic module, the texturing of the inside face of the glass substrate comprises at least one row of mutually parallel grooves, spaced by a distance d, and the texturing of the outside face consists of an array of three-dimensional patterns such as pyramids or cones.

According to an alternative embodiment of the photovoltaic module, the texturing of the inside face of the glass substrate comprises at least one row of mutually parallel grooves, spaced by a distance d, and the texturing of the outside face comprises at least one row of mutually parallel grooves, the grooves of the upper and lower faces being disposed orthogonally with respect to each other.

The invention also relates to the glass substrate such as previously described and having a texturing on its two main faces.

The invention, its various aspects and its advantages will be better understood on reading the following non-limiting examples of embodiment, given purely by way of illustration.

FIG. 1, already previously described, shows two diagrammatic views, in perspective and in cross-section, of a photovoltaic module incorporating a textured glass substrate acting as a concentrator of the solar radiation onto the photovoltaic cells.

FIG. 4a is a diagrammatic representation of a roller according to the prior art, having texturing reliefs whose spacing d is constant, making it possible to obtain, after shaping and rolling, the textured glass substrate shown in FIG. 4b.

FIG. 5a shows a roller according to one embodiment of the invention comprising a roller incorporating reliefs according to the invention, making it possible to obtain, after shaping and rolling, the textured glass substrate shown in FIG. 5b and whose spacing d between two successive grooves is constant.

FIGS. 9a, 9b and 9c show three variants of a second embodiment of a glass substrate textured on its two main faces according to the present invention.

FIG. 5 shows a roller 50 allowing the implementation of the method according to the invention. The roller 50 having a non-constant spacing between the lines of relief 51 and 52 and between the lines of relief 51 and 53 or again between lines 52 and 54. More precisely, in order to obtain a constant spacing d on the pane such as shown in FIG. 5b, it is necessary, when a rolling roller is used, that the spacing between two successive reliefs on the impression means should not be constant along the length of the roller. In this way a substantial improvement of the regularity of the texturing impressed on the glass substrate, in the previously described sense, has been observed by the applicant if the spacing between two successive reliefs on the impressing roller is not constant and in particular is minimal at the center of the roller and maximal at its ends.

Results making it possible to obtain a sufficiently accurate and regular texturing for the use of a substrate in a method of manufacturing a photovoltaic module have been observed in the case in which the increase in the spacing between two successive reliefs is progressive and substantially linear from the center of the roller towards its ends.

Other solutions have made it possible to obtain an entirely satisfactory accuracy of the texturing finally obtained on the glass substrate for the application, in particular in the case where the increase in the spacing between two successive reliefs substantially follows a variation of the parabolic type from the center of the roller towards its ends.

In the sense of the present invention, a linear variation is for example understood to be a variation according to a general law of the type:

$$d_{n+1} = ax_n + b, \text{ where}$$

$d_{n+1}$ is the distance separating two successive reliefs n and n+1 on the roller,
a and b are constants and
$x_n$ is, in absolute value, the distance between the center of the roller and the $n^{th}$ relief.

In the sense of the present invention, parabolic variation is for example understood to be a variation according to a general law of the type:

$$d_{n+1} = ax_n^2 + bx_n + c, \text{ where}$$

$d_{n+1}$ and $x_n$ have the same meaning as before and a, b and c are constants.

Without departing from the scope of the invention, the position of the first relief can indifferently be or not be at the center of the roller.

For embodiments requiring even greater accuracy, high order polynomial functions have also been successfully tested.

The above solution, described with reference to FIGS. 5a and 5b, notably made it possible to obtain, by impression, more complex texturing patterns from rollers whose reliefs were adapted, in particular pyramids with 3, 4, 5 and 6 faces, cones, prisms, with sufficient accuracy to allow an application such as a textured substrate for a photovoltaic module.

Figure 6:
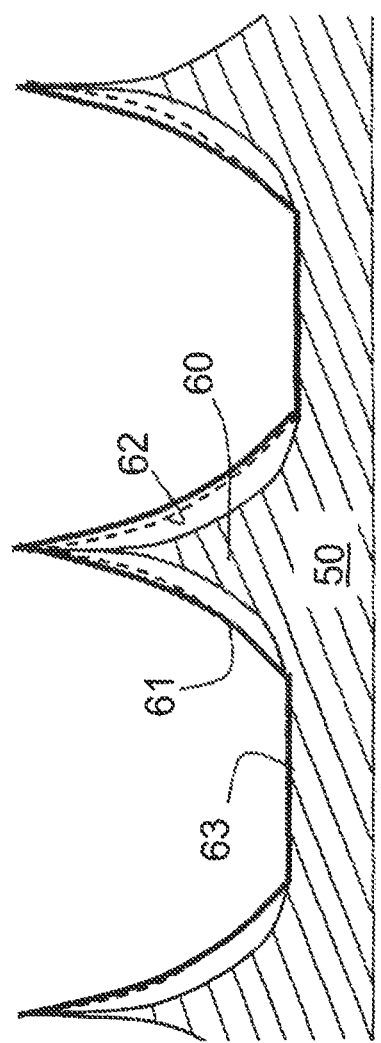
FIG. 6 is a cross-sectional view of one embodiment of the relief present on the surface of the texturing roller.

FIG. 6 shows a typical profile, seen in cross-section, of a relief of the rolling roller 50 of FIG. 5, making it possible to obtain the sought texturing on the substrate.

As the glass does not perfectly succeed in filling the patterns on the rollers, it is possible to compensate for these impression problems by suing adapted patterns on the roller. FIG. 6 shows the profile of the reliefs 60 present on the surface 63 of the roller 50. In the figure, the ideal profile 62 sought on the final glass substrate has been added in dotted line, the solid line 61 representing the profile actually obtained on the glass finally if the roller 50 has the relief 60.

Figure 7:
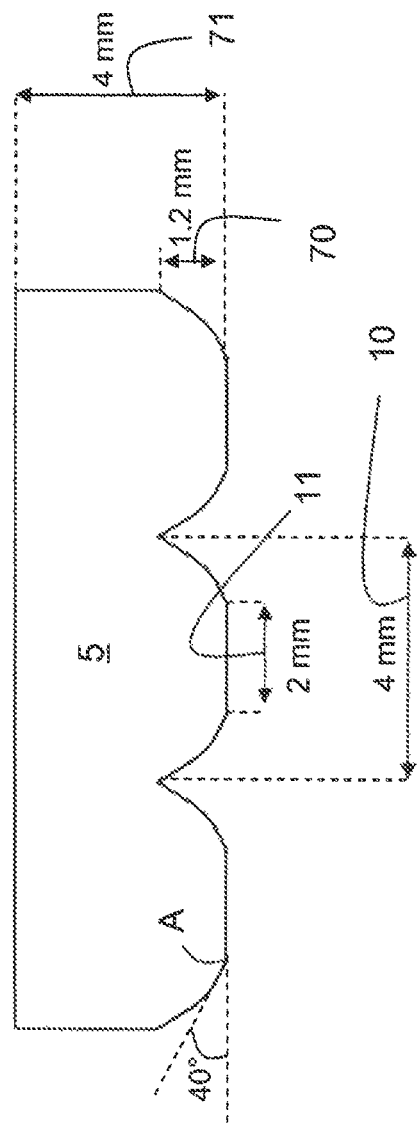
FIG. 7 is a diagrammatic representation of an example embodiment of a typical texturing able to be obtained by application of the present invention.

FIG. 7 shows an example embodiment of a textured glass substrate, obtained by application of the method according to the invention. The textured glass panel 5 has a total thickness of 4 mm and has a spacing 10 between two texturings equal to 4 mm. The depth 70 of the texturing is 1.2 mm. The profile of the texture is parabolic, with a tangent at the point A which forms an angle of 40° with the plane of the panel at the point A. The strips 11, on which the cells will be placed (not shown in FIG. 7), have a width of 2 mm, which corresponds to a concentration factor of 200%.

According to the invention, a roller has been used on which the separation d between two successive reliefs, such as described with reference to FIGS. 5 and 6, follows a parabolic law, in the previously described sense. The variations obtained in the parameters 11, 10, which are characteristic of the texturing, are less than 0.1 mm, or even less than 0.05 mm.

The present invention is not of course limited to the texturing profile shown in FIG. 7. For example, without departing from the scope of the invention, the cells can have a width of between a few mm and several cm and a length of several cm.

More generally, the present invention is applicable to the obtaining of any type of texturing making it possible to obtain a concentration of light, in the previously described sense. Thus, the principles and embodiments described in the present application can be applied to other patterns with a cylindrical geometry obtained for example by a process of rolling the glass between two rollers or another process of impression and/or texturing. By way of example the geometry described in the patent application US2006/0272698A1 can be mentioned.

According to a possible way of manufacturing a substrate by application of the principles of the present invention, it is possible in particular to obtain a textured surface associated with a mirror layer. This configuration makes it possible to obtain advantageous concentration factors. More precisely, a textured glass panel is used at relatively small angles, which is covered with a reflecting layer. The photovoltaic cells according to this mode thus receive both the direct light and the light after reflection. Although the patterns described above are disposed on the lower (or inside) face of the glass substrate, that is to say on the side intended to be placed directly opposite the photovoltaic cells in the module, it is also possible, according to other embodiments of the invention, to place texturing on the two main faces of a glass substrate, that is to say on the inside and outside faces.

By application of the previously described principles and manufacturing method, it has now been possible for the applicant to obtain for the first time a texturing whose accuracy and regularity are sufficient on both opposite faces to allow a substantial increase in the performance of the photovoltaic module.

Thus, the accuracy obtained on the respective profiles of the patterns on the inside and outside faces, and the accuracy obtained in their respective positions, have made it possible to obtain a substantial increase in the concentration factor of the incident solar radiation towards the zones of the inside face of said substrate with which the photovoltaic cells are placed in contact, in the module.

Figure 2:
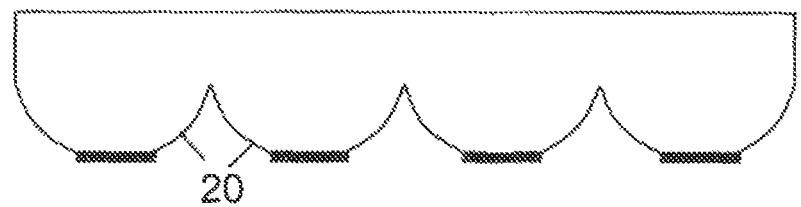
FIG. 2 shows another embodiment in which the texturing exhibits a grooving whose edges are rounded.
Figure 3:
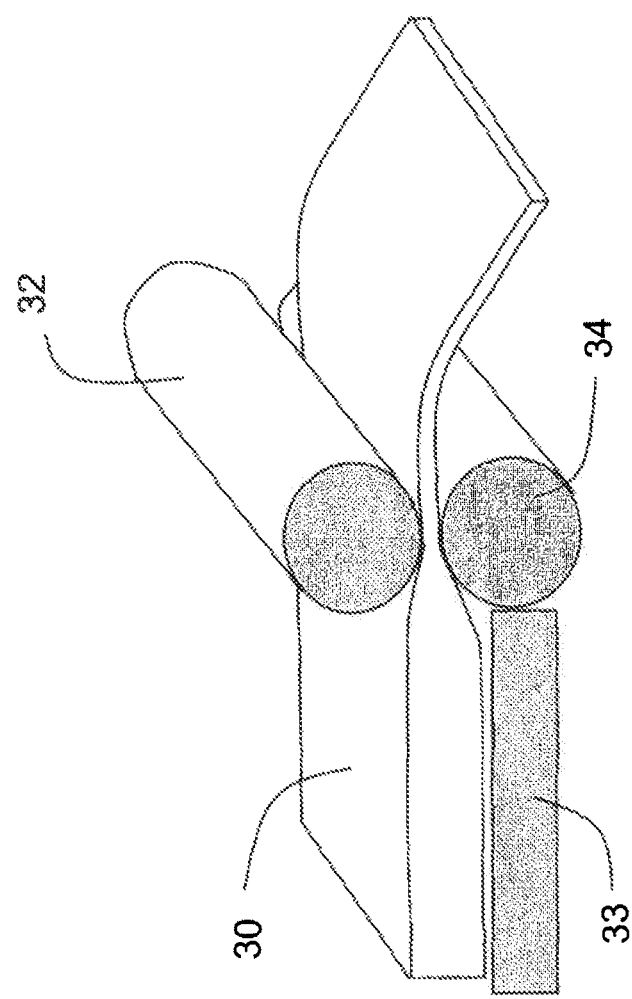
FIG. 3 is a diagrammatic illustration of a rolling method in which rolling rollers are used which furthermore serve as means of texturing, in the sense of the present invention.

More precisely, it has been possible to obtain textured substrates by using, according to the principles described with reference to FIG. 3, lower and upper rollers incorporating reliefs adapted for obtaining the desired profiles, according to the previously described principles.

Examples of substrates textured on both faces and having improved performance are described below with reference to FIGS. 8 to 11.

Figure 8:
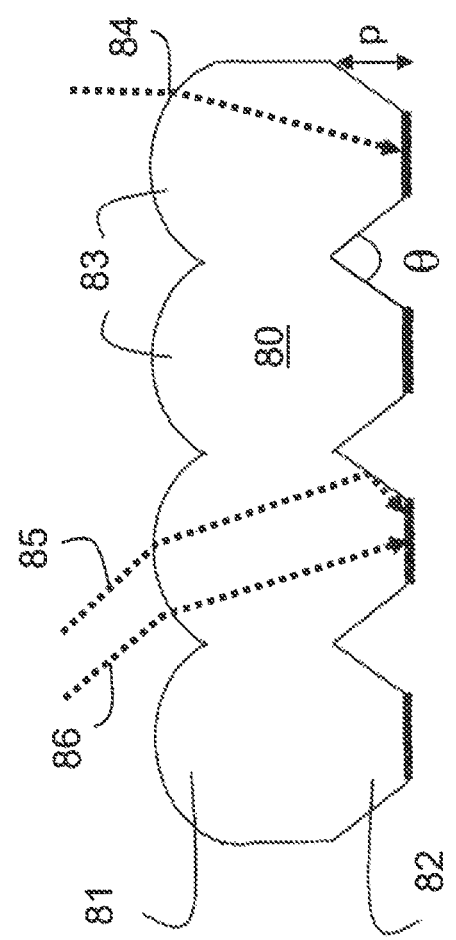
FIG. 8 shows a first embodiment of a glass substrate textured on its two main faces according to the present invention.

FIG. 8 shows a first glass substrate 80 textured on its two faces 81 and 82. The texturing on the inside face 82 corresponds to that already described with reference to FIG. 1 or 7.

The functional principle is the same as that already described with reference to FIG. 1. Additionally, the substrate 80 incorporates on its outside surface 81 a system of cylindrical lenses 83, each lens being centered opposite a subjacent photovoltaic cell.

The tests carried out by the applicant have also shown that with texturing on both faces it is possible, for the same light concentration factor and in comparison with a substrate textured on only its inside face (cf. FIG. 1), to use a less acute angle θ at the apex on the inside face 82 and a smaller depth of texturing p, such as shown in FIG. 8. The cylindrical lenses allow a first redirection of the light rays towards the photovoltaic cells, such as represented by the light path of the ray 84. Other rays 85, 86, can also undergo a total internal reflection if the focusing of the lens is not sufficient.

Such a reduction in the sharpness of the angle θ and in the depth p thus facilitate the manufacture of the glass panel, the obtaining of angles that are too acute being difficult with standard methods of manufacturing the glass substrate such as rolling.

The addition of texturing on the outside face furthermore makes it possible to facilitate the tempering of such a pane. A pane textured on a single face such as the one shown in FIG. 1 has appeared to be very difficult to temper, probably because of the very great asymmetry between the two faces. In fact it appears that the inside texturing favors a deformation of the pane after its tempering. Such a phenomenon has not been observed on a substrate textured on both of its faces.

FIG. 9 shows three variants of a second embodiment of a glass substrate textured on its two faces according to the present invention. The texturing on the inside face according to these three variants remains comparable to that previously described. In these variants, the outside face of the pane exhibits texturing in the form of parallel prisms whose apex is disposed opposite the photovoltaic cells. More precisely, FIG. 9a shows a texturing on the outside face composed of a parallel series of straight triangular prisms 90.

The outside texturing of the substrate shown in FIG. 9b is composed of a succession of parallel triangular prisms 91 whose ends 92 are truncated, identical to or different from those constituting the texturing of the inside face.

The outside texturing of the substrate shown in FIG. 9c is composed of a succession of triangular prisms 93 whose sides 94 are rounded.

Figure 10:
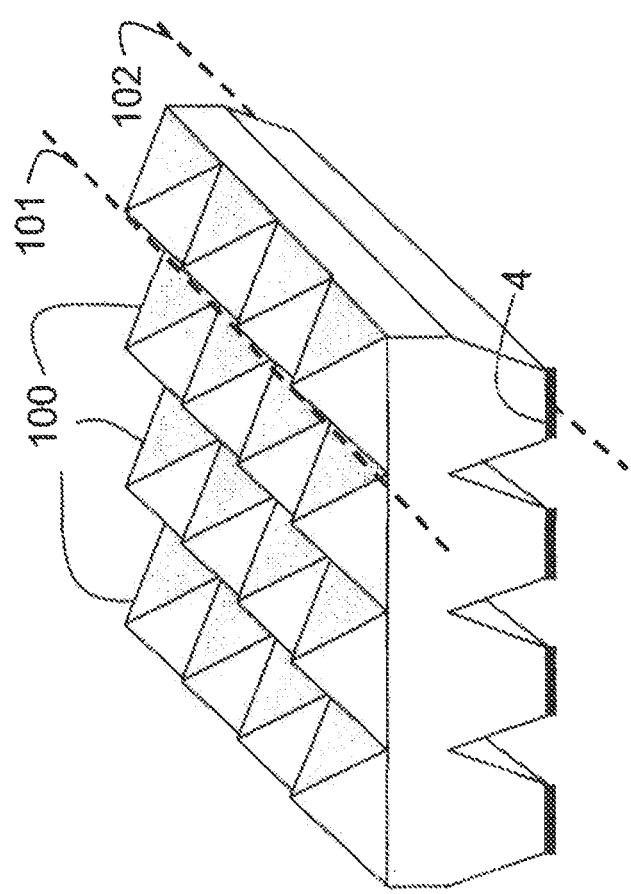
FIG. 10 shows a third embodiment of a glass substrate textured on its two main faces according to the present invention.

FIG. 10 shows another embodiment in which the texturing of the outside face has three-dimensional pyramidal patterns 100. According to this embodiment, the best concentration factors have been obtained when the patterns 100 are disposed such as shown in FIG. 10, that is to say when the apexes of the patterns are inscribed within parallel lines 101 disposed opposite the medians 102 of the strips 4 of photovoltaic cells.

Figure 11:
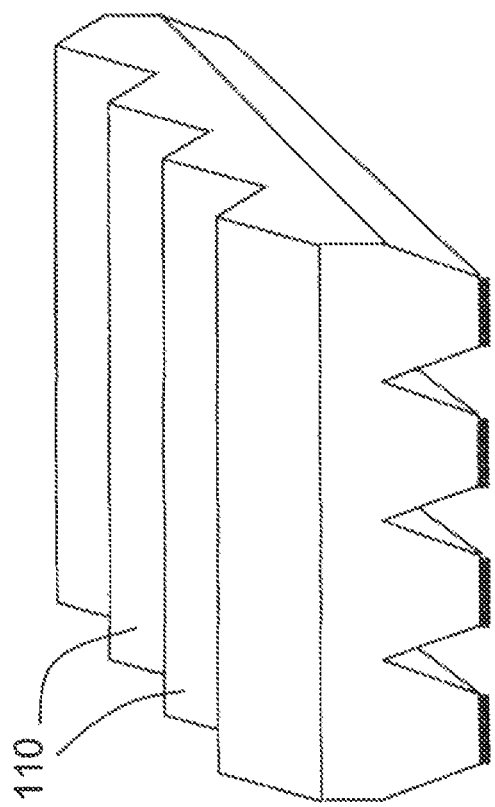
FIG. 11 shows a fourth embodiment of a glass substrate textured on its two main faces according to the present invention.

FIG. 11 shows another embodiment in which the texturing of the outside face is two-dimensional and is in the form of parallel prisms 110 directed orthogonally with respect to the two-dimensional patterns of the inside face. According to this configuration, it has been observed by the applicant that surprisingly good concentration factors could be observed even if the orthogonal texturings disposed facing each other on the two faces were not aligned according to the previously described methods. As a variant, it is also possible according to the invention to dispose cylindrical lenses such as shown in FIG. 8 on the outside face, oriented orthogonally with respect to the two-dimensional patterns of the inside face. Without departing from the scope of the invention, the texturing of the outside face, disposed orthogonally with respect to that of the inside face, can also be of the type described previously with reference to FIG. 9a, 9b or 9c.

These latter variants also have the advantage of substantially simplifying the stage of tempering the glass substrate during its manufacture.

The texturing pattern adapted to the outside face is not limited to those previously described, with reference to FIGS. 8 to 11. Without departing from the scope of the invention, it is possible in particular to use any type of profile in particular making it possible to capture the low incidence light rays and to deflect them towards the photovoltaic cells. Examples of possible texturings of the outside face are for example described in the applications WO03046617, WO2006/134301 or WO2006/134300.

The advantages of the invention are illustrated by the following examples:

In these examples, a roller representing the profile previously described with reference to FIGS. 5 and 6 was used to impress a textured substrate having the geometric features shown in FIG. 7.

Figure 12:
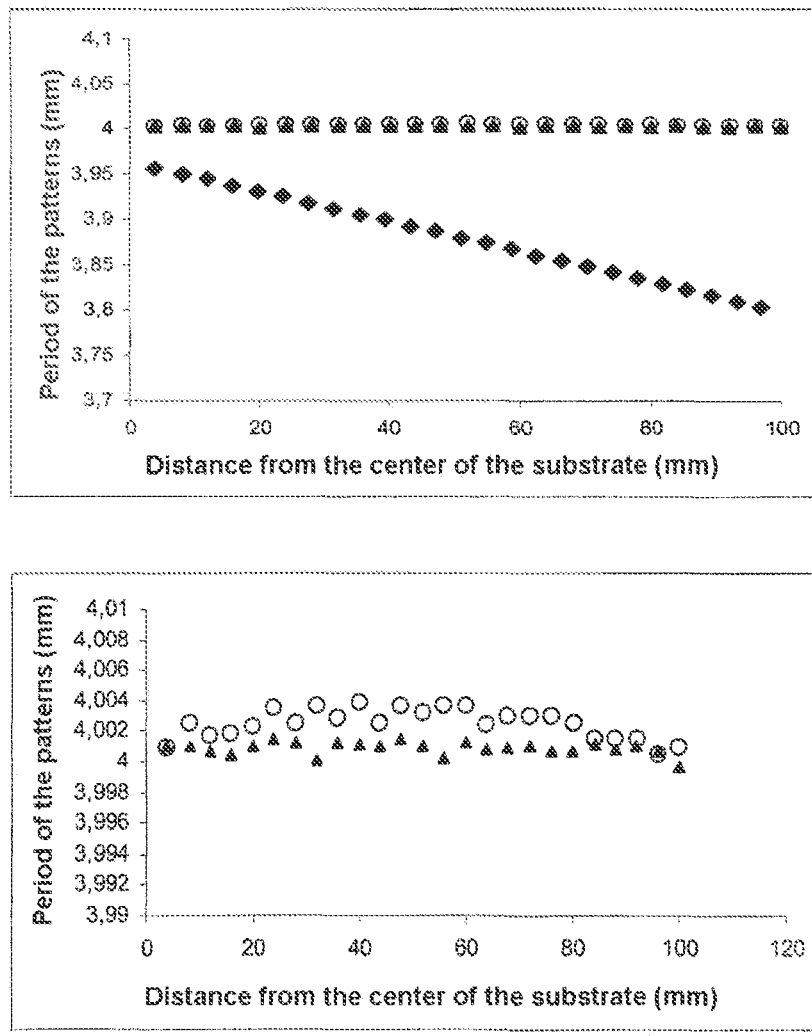
FIG. 12 shows the periodicity between two successive grooves on the textured glass substrate obtained and its enlarged view (bottom).

The graphs shown in FIG. 12 make it possible to appreciate the accuracy procured on the finally obtained glass substrate, as a function of the texturing profile of the roller used. The graph at the bottom is an enlargement of the one at the top, centered on the sought periodicity value for the motif (4 mm).

The technique used for obtaining the glass substrate is a conventional rolling technique, such as described with reference to FIG. 3. The glass used is an Albarino® glass marketed by the Saint-Gobain Glass company.

In FIG. 12:
the square marks illustrate the periodicity of the grooves observed on the finally obtained substrate when the distance d between two reliefs on the roller is constant and equal to 4 mm.,
the circular marks illustrate the periodicity of the grooves observed on the finally obtained substrate when the distance $d_{n+1}$ between two successive reliefs n and n+1 on the roller is not constant and increases linearly according to the formula:

$$d_{n+1}=4.038+1.75\times10^{-4}x_n,$$

in which $d_{n+1}$ (mm) and $x_n$ (mm) have the definitions given previously, the triangular marks illustrate the periodicity of the grooves observed on the finally obtained substrate when the distance $d_{n+1}$ between two successive reliefs n and n+1 on the roller is not constant and increases according to a parabolic law expressed by the formula:

$$d_{n+1} \text{ (mm)}=4.038+1.65\times10^{-4}x_n\text{ (mm)}+10^{-8}x_n^2,$$

in which $d_{n+1}$ (mm) and $x_n$ (mm) have the definitions given previously.

The data given in FIG. 12 show that the periodicity between two successive grooves on the textured glass substrate finally obtained reduces continually as a function of the distance of said grooves with respect to the center of the substrate, in the direction of said texturing. Such a continuous reduction causes, over the most peripheral part of the substrate, a complete shift of the texturing which results, on the one hand, in making an industrial process of assembling the photovoltaic cells on the textured substrate very inaccurate or even impossible and, on the other hand, in reducing the performance of the substrate in terms of light concentration, notably when the latter has a texturing on its two faces whose relative adjustment was impossible up until the present time.

In particular, it can be seen on the graphs of figure that the distance between the successive patterns has a very slight dispersion when the method according to the invention is applied. According to the present invention, this dispersion of the spacing between two successive grooves around the sought value is less than 2% of said distance, is preferably less than 1% of said distance and, in a very preferred way, is less than 0.5% of said distance. It can be seen in FIG. 12 that, in the present example of embodiment of the invention, the dispersion is very much less than 1% of the mean distance d between two successive grooves.

The additional measurements made directly on the pane finally obtained by the use of a parabolic law showed the perfect regularity of the grooves obtained, the deviation measured over the whole dimension of the pane in the direction of the texturing between the position of a groove and its theoretical position always being less than 2% of the mean distance d measured between two successive grooves.

The invention claimed is:

1. A method for obtaining an external covering of a photovoltaic device, said covering comprising a glass substrate having surface texturing in the form of rows of mutually parallel grooves that are spaced from each other by a regular distance d from the center of the external covering to ends of the external covering, the method comprising:
   providing a heat softened glass substrate at a first temperature;
   applying a roller having parallel reliefs to a surface of the heat softened glass substrate to thereby imprint said parallel reliefs onto the glass substrate; and
   cooling the imprinted glass substrate to a second temperature to thereby form the external covering of a photovoltaic device having said surface texturing:
   wherein the spacing of successive parallel reliefs on the impressing roller are less at the center of the roller compared to the ends of the roller; and
   wherein said successive reliefs are spaced to account for lateral contraction of the glass substrate between the first and second temperatures to thereby produce said texturing having rows of mutually parallel grooves spaced from each other by a regular distance d.

2. The method as claimed in claim 1, wherein the increase in the spacing between two successive reliefs from the center of the roller towards its ends is progressive and linear.

3. The method as claimed in claim 1, wherein the increase in the spacing between two successive reliefs from the center of the roller towards its ends is progressive and follows a parabolic law or a polynomial law of higher order.

* * * * *